(12) United States Patent
Lee

(10) Patent No.: US 9,330,739 B2
(45) Date of Patent: May 3, 2016

(54) SEMICONDUCTOR DEVICE HAVING HIGH-VOLTAGE TRANSISTOR

(75) Inventor: Dong Hwan Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 749 days.

(21) Appl. No.: 13/602,887

(22) Filed: Sep. 4, 2012

(65) Prior Publication Data

US 2013/0163365 A1 Jun. 27, 2013

(30) Foreign Application Priority Data

Dec. 22, 2011 (KR) .................... 10-2011-0139986

(51) Int. Cl.
| | | |
|---|---|---|
| *G11C 16/04* | (2006.01) | |
| *G11C 7/00* | (2006.01) | |
| *G11C 11/00* | (2006.01) | |
| *G11C 7/18* | (2006.01) | |
| *H01L 27/02* | (2006.01) | |
| *H01L 27/105* | (2006.01) | |
| *H01L 27/108* | (2006.01) | |

(52) U.S. Cl.
CPC .............. *G11C 7/18* (2013.01); *H01L 27/0207* (2013.01); *H01L 27/105* (2013.01); *H01L 27/1052* (2013.01); *G11C 16/0483* (2013.01); *H01L 27/10885* (2013.01)

(58) Field of Classification Search
CPC ........... G11C 16/0483; G11C 11/5628; G11C 11/5642; G11C 16/24; G11C 16/26; G11C 5/145; G11C 5/147; G11C 11/56; G11C 7/1051; G11C 8/10; G11C 16/04; G11C 16/10; G11C 8/06; G11C 16/08; G11C 16/14; G11C 2211/5621; G11C 16/344
USPC .............. 365/189.05, 189.09, 189.08, 230.03
See application file for complete search history.

(56) References Cited

U.S. PATENT DOCUMENTS

| | | | | |
|---|---|---|---|---|
| 6,879,520 B2* | 4/2005 | Hosono | ............... | G11C 11/5642 365/185.17 |
| 8,665,648 B2* | 3/2014 | Mun | .................. | G11C 16/0483 365/185.17 |
| 2007/0086243 A1* | 4/2007 | Jo | .......................... | G11C 16/24 365/185.08 |
| 2008/0123423 A1* | 5/2008 | Kim | ...................... | G11C 5/025 365/185.11 |
| 2012/0163093 A1* | 6/2012 | Aritome | ............. | G11C 11/5628 365/185.19 |
| 2012/0170379 A1* | 7/2012 | Ahn | ................... | G11C 11/5642 365/185.25 |
| 2012/0243342 A1* | 9/2012 | Lee | .................... | G11C 16/0483 365/189.05 |

\* cited by examiner

Primary Examiner — Hien Nguyen
(74) Attorney, Agent, or Firm — IP & T Group LLP

(57) ABSTRACT

A semiconductor device includes a memory cell array having a plurality of memory cells respectively coupled to first and second bit lines, page buffers, and a bit line selection circuit including a plurality of selection circuit blocks configured to couple the first or second bit lines to the page buffers. A pair of the first and second bit lines is disposed in each of the plurality of selection circuits so that first bit lines of adjacent selection circuit blocks face each other, or second bit lines of adjacent selection circuit blocks face each other.

11 Claims, 7 Drawing Sheets

SEMICONDUCTOR DEVICE HAVING HIGH-VOLTAGE TRANSISTOR

CROSS-REFERENCE TO RELATED APPLICATION

This application claims priority to and the benefit of Korean Patent Application No. 10-2011-0139986, filed on Dec. 22, 2011, the disclosure of which is incorporated herein by reference in its entirety.

BACKGROUND

The present invention relates to a semiconductor device, and more particularly, the present invention relates to a semiconductor device having a high-voltage transistor.

A semiconductor device may include a memory cell array including a plurality of memory cells configured to store data and a plurality of peripheral circuits configured to program or erase data into or from the memory cells or read out data stored in the memory cells.

The peripheral circuits may include a plurality of page buffers coupled to the memory cell array through bit lines. The page buffers may provide a program permission voltage or a program prohibition voltage through the bit lines in a program operation and receive states of cells through the bit lines in a read operation.

Meanwhile, interference may occur between adjacent bit lines as a degree of integration of a semiconductor device increases. Thus, in order to prevent the interference, the bit lines are classified into even-numbered bit lines and odd-numbered bit lines. The even-numbered bit lines may be called even bit lines, and the odd-numbered bit lines may be called odd bit lines. Since each of the page buffers is coupled to a bit line pair including an even bit line and an odd bit line, each of the page buffers may include a bit line selection circuit configured to select the even bit line or and the odd bit line of the bit line pair.

FIG. 1 illustrates a layout diagram of a conventional semiconductor device.

Referring to FIG. 1, a page buffer of the semiconductor device may include a bit line selection circuit configured to select an even bit line BLe or an odd bit line BLo in a bit line pair. The bit line selection circuit may include a bit line precharge circuit configured to precharge the even bit line BLe or the odd bit line BLo and a selection circuit configured to select the even bit line BLe or the odd bit line BLo. A portion of the selection circuit is illustrated in FIG. 1.

The selection circuit may include a plurality of transistors TR each of which is configured to select an even or odd bit line in a bit line pair. The transistor TR may be formed in an active region AT of a semiconductor substrate. As the numbers of even and odd bit lines BLe and BLo increase, when all the transistors TR are included in the active region AT disposed on a single line, the length of the selection circuit may significantly increase. Accordingly, selection circuits may be divided into groups, e.g., selection circuit blocks, and respective selection circuit blocks may be disposed apart from one another in a first direction. Each of the selection circuit blocks may include a plurality of selection circuits spaced apart from one another in a second direction perpendicular to the first direction. Each of the selection circuits may include a plurality of contact plugs and a plurality of transistors formed in the active region AT of the semiconductor substrate. Specifically, each of the selection circuits may include a first contact plug, a first gate line, a second contact plug, a second gate line, and a third contact plug disposed sequentially in the first direction. In the same selection circuit block, the first and second gate lines may be disposed across all the active regions AT. Even bit lines BLe may be coupled to the first contact plug, and odd bit lines BLo may be coupled to the third contact plug. Space between the respective active regions AT may be defined as an isolation region IS, which may be filled with an insulating material.

In particular, since a group of even bit lines BLe and a group of odd bit lines BLo are alternately arranged, the even bit lines BLe and the odd bit lines BLo may face each other in adjacent selection circuit regions. For example, when a first group of even bit lines BLe and a first group of odd bit lines BLo are arranged in the first direction in a first selection circuit region, a second group of even bit lines BLe and a second group of odd bit lines BLo may be arranged in the first direction even in a second selection circuit region disposed adjacent to the first selection circuit region in the first direction. Accordingly, the first group of odd bit lines BLo disposed in the first selection circuit region may be disposed opposite to the second group of even bit lines BLe disposed in the second selection circuit region. As described above, when different groups of bit lines are arranged opposite to each other, depletion may occur in the semiconductor substrate disposed under the isolation region IS. To prevent the depletion from occurring, a field stop ion implantation region FS may be formed by performing an ion implantation process on a portion of the semiconductor substrate disposed under the isolation region IS. This configuration will be described in detail with reference to the accompanying drawings.

FIG. 2 is a cross-sectional view taken along a line A-A' in FIG. 1.

Referring to FIG. 2, an isolation region IS is formed to define active regions AT in a semiconductor substrate 10 and filled with an insulating material 14. Gate lines of transistors TR are formed on the active region AT in the semiconductor substrate 10, and junction regions 12 are formed in the semiconductor substrate 10 adjacent to both ends of each of the gate lines. Thus, the transistors TR including the gate lines and the junction regions 12 are formed. After that, an interlayer insulating layer 17 is formed to cover a resultant structure including the transistors TR, and contact plugs CP are formed on the junction regions 12 to penetrate the interlayer insulating layer 17. Each of bit lines no and BLe is formed over the interlayer insulating layer 17 to be coupled to each of the contact plugs CP.

When high-voltage transistors are formed in a selection circuit region and different voltages are applied to junction regions 12 formed in different active regions AT, depletion may occur in a region between the junction regions 12 in the different active regions AT. To prevent the occurrence of the depletion, an ion implantation process may be performed onto a portion of the semiconductor substrate 10 disposed under the isolation region IS, thereby forming a field stop ion implantation region FS. The field stop ion implantation region FS may be formed by implanting impurities having a different type from that of the junction region 12 formed in the active region AT. Accordingly, if a distance between the field stop ion implantation region FS and the junction region 12 is excessively reduced, a breakdown (BD) voltage may be lowered. To prevent this phenomenon from occurring, a minimum distance between the field stop ion implantation region FS and the junction region 12 should be secured. As a result, an area occupied by a semiconductor device may increase depending on a width W of the field stop ion implantation region FS and the minimum distance between the field stop ion implantation region FS and the junction region 12.

SUMMARY OF THE INVENTION

Embodiments of the present invention are directed to a semiconductor device having a high-voltage transistor. In this semiconductor device, to reduce the size of the semiconductor device, positions of an even bit line and an odd bit line are changed in a selection circuit block configured to select the even bit line or the odd bit line, such that a field stop region needs not be included in an isolation region.

One aspect of the present invention provides a semiconductor device including: a memory cell array including a plurality of memory cells coupled to first and second bit lines, page buffers, and a plurality of bit line selection circuit blocks, each of which includes a plurality of selection circuits configured to couple the first or second bit lines to the page buffers, wherein a pair of the first and second bit lines is disposed in each of the plurality of selection circuits, so that first bit lines of adjacent selection circuit blocks face each other or second bit lines of adjacent selection circuit blocks face each other.

Another aspect of the present invention provides a semiconductor device including: a memory cell array in which data is stored, and a page buffer group connected to the memory cell array through even and odd bit lines, the page buffer group including a plurality of bit line selection circuit groups configured to select the even or odd bit lines. Each of the bit line selection circuit groups includes an even bit line group including some of the even bit lines, an odd bit line group including the odd bit lines, an even gate line connected to a transistor configured to select the even bit line group, and an odd gate line connected to a transistor configured to select the odd bit line groups. The even gate line and the odd gate line are horizontally disposed between the even bit line group and the odd bit line group, the even bit line groups of different bit line selection circuit groups are disposed to face each other, and the odd bit line groups of different bit line selection circuit groups are disposed to face each other.

Still another aspect of the present invention provides a semiconductor device including: a memory cell array in which data is stored, and a page buffer group connected to the memory cell array through bit lines, the page buffer group including bit line selection circuit groups horizontally disposed in a first direction to select even bit lines or odd bit lines out of the bit lines. Each of the bit line selection circuit groups includes a bit line group including the even bit lines, a bit line group including the odd bit lines, and gate lines horizontally disposed between the bit line groups, and the bit line groups and the gate lines disposed in adjacent bit line selection circuits are symmetrically disposed.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Embodiments of the present invention will be described with reference to the accompanying drawings. The present invention may, however, be embodied in different forms and should not be construed as limited to the embodiments set forth herein. Rather, the embodiments are provided so that this disclosure is thorough and complete and fully conveys the scope of the present invention to one skilled in the art.

Figure 1:
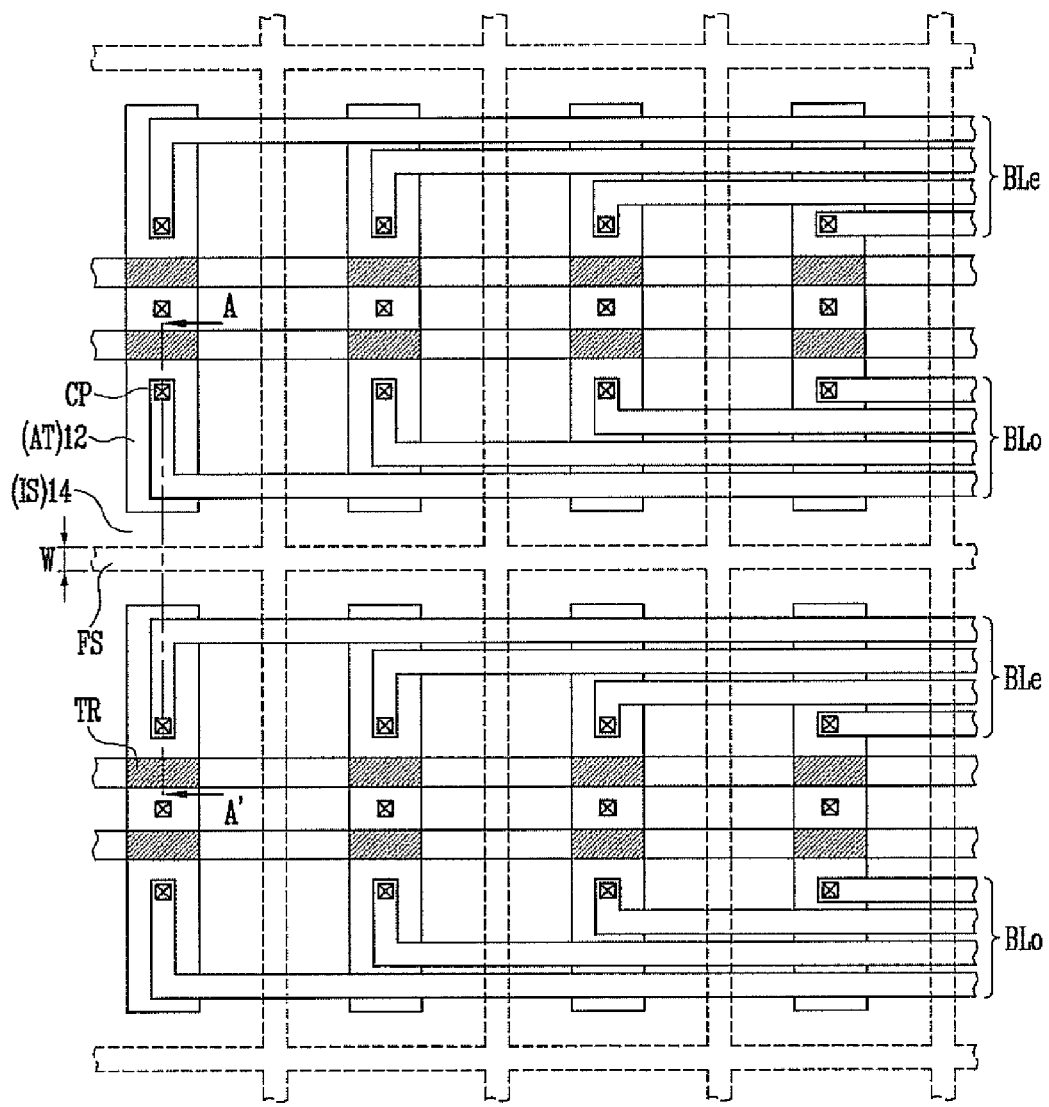
FIG. 1 illustrates a layout diagram of a conventional semiconductor device.
Figure 2:
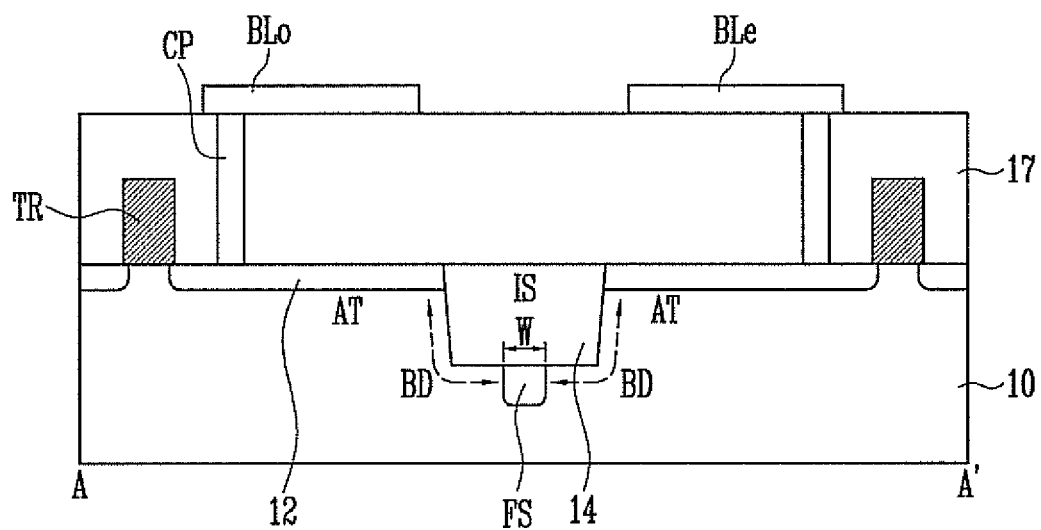
FIG. 2 illustrates a cross-sectional view taken along a line A-A' in FIG. 1.
Figure 3:
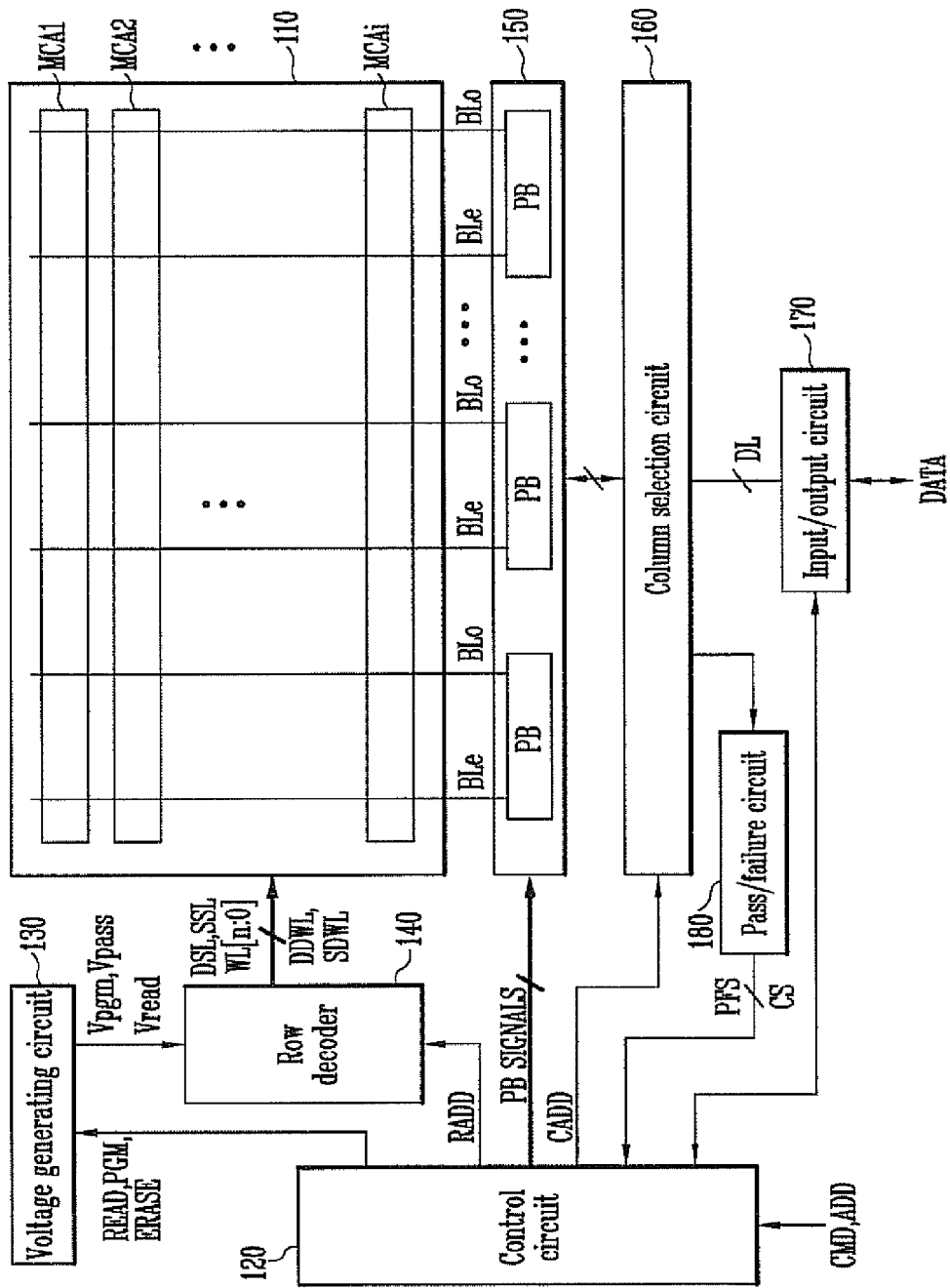
FIG. 3 illustrates a block diagram of a semiconductor device according to an embodiment of the present invention.

FIG. 3 illustrates a block diagram of a semiconductor device according to an embodiment of the present invention.

Referring to FIG. 3, the semiconductor memory device includes a memory cell array 110, circuits 130, 140, 150, 160, 170, and 180 configured to perform a program operation, a read operation, or an erase operation on memory cells included in the memory cell array 110, and a control circuit 120 configured to control the circuits 130, 140, 150, 160, 170, and 180 to set threshold voltage levels of selected memory cells according to input data.

In case of the semiconductor memory device including a NAND flash memory device, the memory device may include a voltage generating circuit 130, a row decoder 140, a page buffer circuit 150, a column selection circuit 160, an input/output (I/O) circuit 170, and a pass/failure determining circuit 180.

The memory cell array 110 may include a plurality of cell blocks MCA1 to MCAi, and each cell block may include a plurality of memory cells in which data is stored. Even and odd bit lines BLe and BLo may be shared by the cell blocks MCA1 to MCAi. That is, the even bit lines BLe may be coupled not only to a first cell block MCA1 but also to the remaining cell blocks MCA2 to MCAi. Similarly, the odd bit lines BLo may be coupled not only to the first cell block MCA1 but also to the remaining cell blocks MCA2 to MCAi.

The control circuit 120 internally outputs a program operation signal PGM, a read operation signal READ, or an erase operation signal ERASE in response to a command signal CMD to the voltage generating circuit 130, and outputs page buffer signals PB SIGNALS to control a plurality of page buffers PB included in the page buffer circuit 150 in response to the command signal CMD. In addition, the control circuit 120 internally outputs a row address signal RADD and a column address signal CADD in response to an address signal ADD. Moreover, the control circuit 120 may confirm whether threshold voltages of selected memory cells are elevated to a target level or not in response to a counting signal CS output from the pass/failure determining circuit 180 during a program verification operation, and determine whether a program operation is to be re-performed or ended based on the confirmation result.

A voltage supply circuit may supply voltages required for programming, reading, or erasing memory cells to a drain selection line DSL, a drain dummy line DDWL, word lines WL0 to WLn, a source dummy line SDWL, and a source selection line SSL in response to the signals READ, PGM, ERASE, and RADD provided from the control circuit 120. In accordance with an embodiment, the voltage supply circuit includes the voltage generating circuit 130 and the row decoder 140.

The voltage generating circuit 130 outputs operation voltages for programming, reading, or erasing memory cells to global lines in response to the operation signals PGM, READ, and ERASE, which are internal command signals. When the memory cells are to be programmed, the voltage generating circuit 130 outputs operation voltages, e.g., Vpgm, Vpass, and Vread, for the program operation to the global lines. In addition, when the memory cells are to be erased, the voltage generating circuit 130 applies a ground voltage to the word lines WL[n:0] or floats the word lines WL[n:0].

The row decoder 140 transmits the operation voltages Vpgm, Vpass, and Vread generated by the voltage generating circuit 130 to local lines DSL, WL[n:0], and SSL and dummy lines DDWL and SDWL of a selected cell block in response to the row address signals RADD from the control circuit 120.

The page buffer circuit 150 may include page buffers PB respectively coupled to the even and odd bit lines BLe and BLo. Each of the page buffers PB corresponds to a pair of bit lines, i.e., a bit line pair including even and odd bit lines BLe and BLo, and selects the even bit line BLe or the odd bit line BLo in response to the page buffer signals PB SIGNALS output from the control circuit 120. Specifically, during a program, read, or erase operation of memory cells, the page buffer circuit 150 precharges the even or odd bit lines BLe or BLo or latches data corresponding to detected threshold voltage levels of memory cells according to a voltage variation of the even or odd bit lines BLe or BLo. That is, in the program operation, the page buffer circuit 150 applies a program permission voltage, e.g., a ground voltage, or a program prohibition voltage, e.g., a power supply voltage, to bit lines according to input data. In the read operation, the page buffer circuit 150 receives voltages of the even and odd bit lines BLe and BLo according to output data read out of the memory cells to detect data stored in the memory cells.

The column selection circuit 160 selects a page buffer PB included in the page buffer circuit 150 in response to the column address signal CADD provided from the control circuit 120, and outputs data latched in the selected page buffer PB to a selected bit line.

The I/O circuit 170 transmits input data DATA to the column selection circuit 160 under the control of the control circuit 120 to input the input data DATA to each of the page buffers PB1 to PBj of the page buffer circuit 150. When the input data DATA is sequentially transmitted to the page buffers PB1 to PBj of the page buffer circuit 150, the page buffers PB1 to PBj store the input data DATA in internal latches. Furthermore, in the read operation, the I/O circuit 170 outputs the output data transmitted from the page buffers PB1 to PBj of the page buffer circuit 150 through the column selection circuit 160 to an external device.

The pass/failure determining circuit 180 checks if there are failed memory cells having threshold voltages lower than a target voltage level among programmed memory cells in a program verification operation performed after the program operation, and outputs a check signal PFS representing the checking results. If there are the failed memory cells, the pass/failure determining circuit 180 counts the number of the failed memory cells and outputs the counting results as a counting signal CS. The control circuit 120 controls the voltage generating circuit 130 to adjust a level of a program voltage applied to a selected word line during the program operation and to selectively apply verification voltages to a selected word line during the program verification operation. In this case, the control circuit 120 controls the voltage generating circuit 130 in response to the counting signal CS provided from the pass/failure determining circuit 180.

Figure 4:
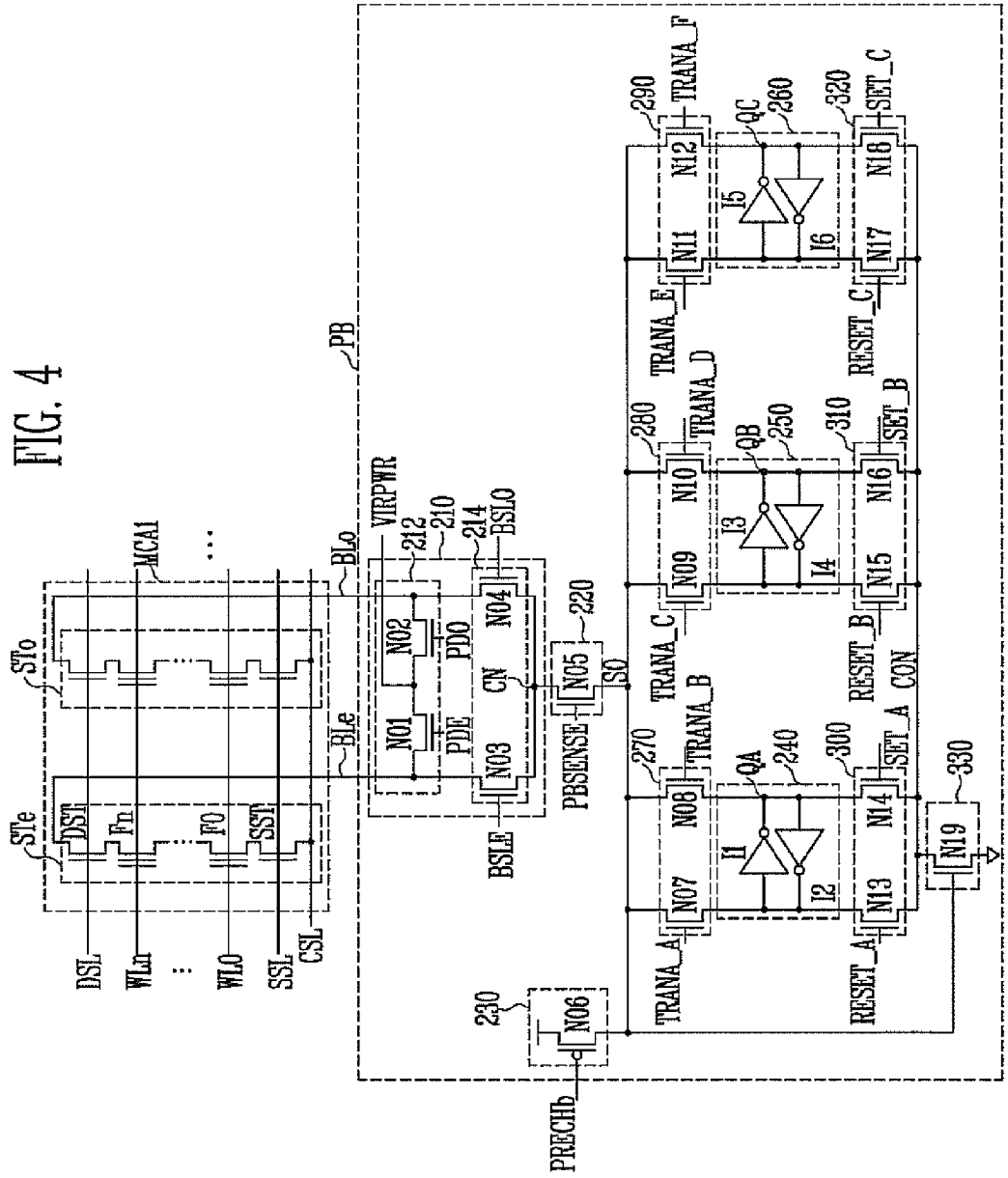
FIG. 4 illustrates a detailed circuit diagram of a cell block and a page buffer shown in FIG. 3.

FIG. 4 illustrates a detailed circuit diagram of a cell block MCA and a page buffer PB shown in FIG. 3.

Referring to FIG. 4, only the first cell block MCA1 and one page buffer PB corresponding thereto are illustrated for convenience of description. Since the page buffer PB transmits a high voltage, a high-voltage transistor may be used as a switch transistor, which will be described in detail hereinafter.

The page buffer PB includes a bit line selection circuit 210 configured to select an even bit line BLe or an odd bit line BLo, a sensing circuit 220 configured to transmit a voltage of the selected bit line to a sensing node SO in a read operation, a precharge circuit 230 configured to precharge the sensing node SO, a first latch 240, a second latch 250, and a third latch 260 configured to latch data, a first transmission circuit 270 configured to transmit data stored in the first latch 240 to the sensing node SO, a second transmission circuit 280 configured to transmit data stored in the second latch 250 to the sensing node SO, a third transmission circuit 290 configured to transmit data stored in the third latch 260 to the sensing node SO, a first set/reset circuit 300 configured to set up or reset the first latch 240, a second set/reset circuit 310 configured to set up or reset the second latch 250, a third set/reset circuit 320 configured to set up or reset the third latch 260, and a discharge circuit 330 configured to discharge a common node CON of the first to third set/rest circuits 300, 310, and 320.

The bit line selection circuit 210 includes a bit line precharge circuit 212 configured to precharge the even bit line BLe or the odd bit line BLo during a program operation and a selection circuit 214 configured to select the even bit line BLe or the odd bit line BLo.

The bit line precharge circuit 212 includes a first switch N01 configured to precharge the even bit line BLe in response to an even precharge signal PDE and a second switch N02 configured to precharge the odd bit line BLo in response to an odd precharge signal PDO. The first switch N01 may include an NMOS transistor coupled to and disposed between the even bit line BLe and a virtual power terminal to which a virtual power VIRPWR is applied, and the second switch N02 may include an NMOS transistor coupled to and disposed between the odd bit line BLo and the virtual power terminal.

The selection circuit 214 includes a third switch N03 configured to select the even bit line BLe in response to an even selection signal BSLE and a fourth switch N04 configured to select the odd bit line BLo in response to an odd selection signal BSLO. The third switch N03 is coupled to and disposed between the even bit line BLe and a node CN, and the fourth switch N04 is coupled to and disposed between the odd bit line BLo and the node CN. Each of the third and fourth switches N03 and N04 may include an NMOS transistor.

The sensing circuit 220 may include a fifth switch N05 configured to couple a selected bit line and the sensing node SO in response to a sensing signal PBSENSE. The fifth switch N05 may include an NMOS transistor coupled to and disposed between the node CN and the sensing node SO.

The precharge circuit 230 includes a sixth switch N06 configured to couple a power supply terminal to which a power supply voltage VDD is applied and the sensing node SO to precharge the sensing node SO with the power supply voltage VDD in response to a precharge signal PRECHb. The sixth switch N06 may include a PMOS transistor.

The first latch 240 includes first and second inverters I1 and I2. An output terminal of the first inverter I1 is connected to an input terminal of the second inverter I2, and an output terminal of the second inverter I2 is connected to an input terminal of the first inverter I1. Data QA stored in the first latch 240 is determined by a voltage level at the output terminal of the first inverter I1. For example, if the output terminal of the first inverter I1 has a high voltage level, the data DQ stored in the first latch 240 may be set to a logical value '1.' On the other hand, if the output terminal of the first inverter I1 has a low voltage level, the data QA stored in the first latch 240 may be set to a logical value '0.'

The second latch 250 includes third and fourth inverters I3 and I4. An output terminal of the third inverter I3 is connected to an input terminal of the fourth inverter I4, and an output terminal of the fourth inverter I4 is connected to an input terminal of the third inverter I3. Data QB stored in the second latch 250 is determined by a voltage level at the output terminal of the third inverter I3. For instance, if the output terminal of the third inverter I3 has a high voltage level, the data QB stored in the second latch 250 may be se to a logical value '1.' On the other hand, if the output terminal of the third inverter I3 has a low voltage level, the data QB stored in the second latch 250 may be set to a logical value '0.'

The third latch 260 includes fifth and sixth inverters I5 and I6. An output terminal of the fifth inverter I5 is connected to an input terminal of the sixth inverter I6, and an output terminal of the sixth inverter I6 is connected to an input terminal of the fifth inverter I5. Data QC stored in the third latch 260 is determined by a voltage level at the output terminal of the fifth inverter I5. For example, if the output terminal of the fifth inverter I5 has a high voltage level, the data QC stored in the third latch 260 may be set to a logical value '1.' On the other hand, if the output terminal of the fifth inverter I5 has a low voltage level, the data QC stored in the third latch 260 may be set to a logical value '0.' Although FIG. 4 shows the page buffer PB including only three latches 240 to 260, a larger number of latches may be included in the page buffer PB.

The first transmission circuit 270 includes a seventh switch N07 configured to couple the input terminal of the first inverter I1 to the sensing node SO in response to a first transmission signal TRANA_A and an eighth switch N08 configured to couple the output terminal of the first inverter I1 to the sensing node SO in response to a second transmission signal TRANA_B. Each of the seventh and eighth switches N07 and N08 may include an NMOS transistor.

The second transmission circuit 280 includes a ninth switch N09 configured to couple the input terminal of the third inverter I3 to the sensing node SO in response to a third transmission signal TRANA_C and a tenth switch N10 configured to couple the output terminal of the third inverter I3 to the sensing node SO in response to a fourth transmission signal TRANA_D. Each of the ninth and tenth switches N09 and N10 may include an NMOS transistor.

The third transmission circuit 290 includes an eleventh switch N11 configured to couple the input terminal of the fifth inverter I5 to the sensing node SO in response to a fifth transmission signal TRANA_E and a twelfth switch N12 configured to couple the output terminal of the fifth inverter I5 to the sensing node SO in response to a sixth transmission signal TRANA_F. Each of the eleventh and twelfth switches N11 and N12 may include an NMOS transistor.

The first set/reset circuit 300 includes a thirteenth switch N13 and a fourteenth switch N14. The thirteenth switch N13 couples the output terminal of the second inverter I2 to the common node CON and resets the first latch 240 in response to a first reset signal RESET_A. The fourteenth switch N14 couples the input terminal of the second inverter I2 to the common node CON and sets up the first latch 240 in response to a first set signal SET_A. Each of the thirteenth and fourteenth switches N13 and N14 may include an NMOS transistor.

The second set/reset circuit 310 includes a fifteenth switch N15 and a sixteenth switch N16. The fifteenth switch N15 couples the output terminal of the fourth inverter I4 to the common node CON and resets the second latch 250 in response to a second reset signal RESET_B. The sixteenth switch N16 couples the input terminal of the fourth inverter I4 to the common node CON and sets up the second latch 250 in response to a second set signal SET_B. Each of the fifteenth and sixteenth switches N15 and N16 may include an NMOS transistor.

The third set/reset circuit 320 includes a seventeenth switch N17 and an eighteenth switch N18. The seventeenth switch N17 couples the output terminal of the sixth inverter I6 to the common node CON and resets the third latch 260 in response to a third reset signal RESET_C. The eighteenth switch N18 couples the input terminal of the sixth inverter I6 to the common node CON and sets up the third latch 260 in response to a third set signal SET_C. Each of the seventeenth and eighteenth switches N17 and N18 may include an NMOS transistor.

The discharge circuit 330 includes a nineteenth switch N19 configured to couple the common node CON to a ground voltage terminal Vss and discharge the common node CON in response to a signal of the sensing node SO. The nineteenth switch N19 may include an NMOS transistor.

Figure 5:
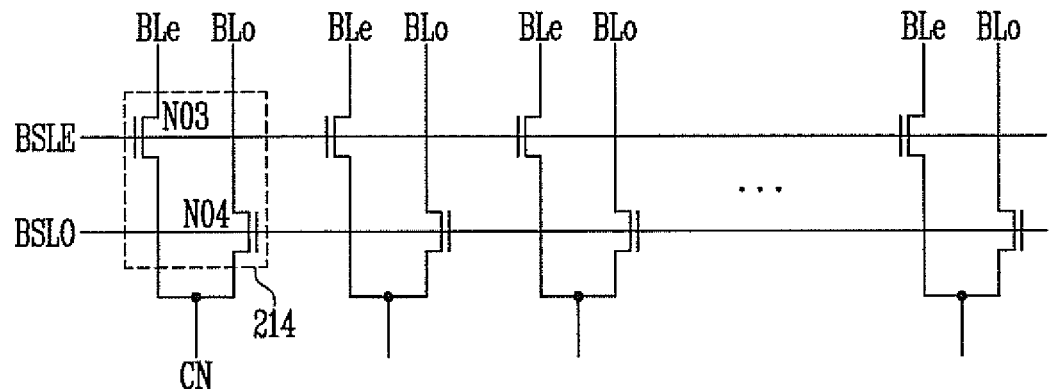
FIG. 5 illustrates a circuit diagram of a selection circuit shown in FIG. 4.

FIG. 5 illustrates a circuit diagram of the selection circuit 214 in FIG. 4.

Referring to FIG. 5, the number of selection circuits 214 corresponds to the number of page buffers PB. Each of the selection circuits 214 includes switch transistors N03 and N04 coupled to and disposed between a pair of even and odd bit lines BLe and BLo and a node CN. Among transistors included in the selection circuits 214, gates of the transistors N03 coupled to the even bit lines BLe are coupled to a gate line to which an even selection signal BSLE is applied, and gates of the transistors N04 coupled to the odd bit lines BLo are coupled to a gate line to which an odd selection signal BSLO is applied. Accordingly, if the even selection signal BSLE is enabled, all the even bit lines BLe are coupled to the node CN. On the other hand, if the odd selection signal BSLO is enabled, all the odd bit lines BLo are coupled to the node CN.

The layout of the above-described selection circuit will be described hereinafter with reference to FIG. 6.

Figure 6:
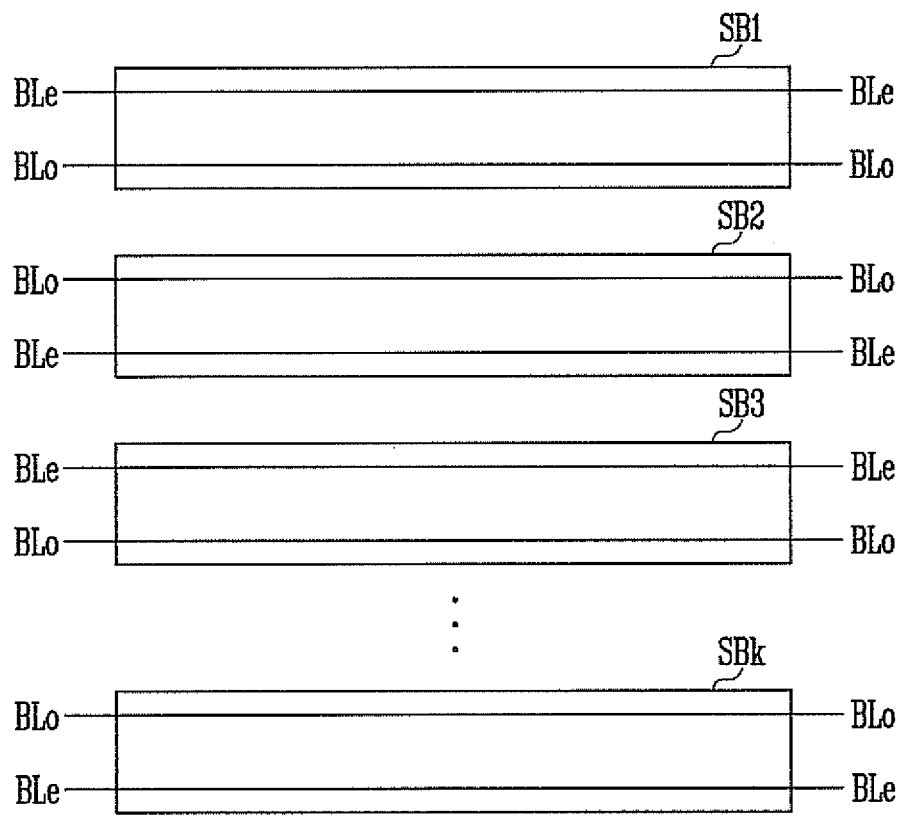
FIG. 6 illustrates the layout of a selection circuit according to an embodiment of the present invention.

FIG. 6 illustrates the layout of a selection circuit according to an embodiment of the present invention.

Referring to FIG. 6, since a very large number of bit lines BLe and BLo are included in a semiconductor device, a large number selection circuits may also be included. Accordingly, since a very long layout region is required to arrange the selection circuits in a second direction, a plurality of selection circuit blocks SB1 to SBk arranged in a first direction perpendicular to the second direction may be provided, and a plurality of selection circuits may be included in each of the selection circuit blocks SB1 to SBk. Furthermore, a plurality of even and odd bit lines BLe and BLo may be arranged in each of the selection circuit blocks SB1 to SBk. In particular, among bit lines coupled to selection circuit blocks adjacent to each other, bit lines having the same type may be arranged to face each other. Specifically, if a plurality of even bit lines BLe and a plurality of odd bit lines BLo are arranged in the first direction in the first selection circuit block SB1, a plurality of odd bit lines BLo and a plurality of even bit lines BLe may be arranged in the first direction in the second selection circuit block SB2. Accordingly, the odd bit lines BLo of the first selection circuit block SB1 may be arranged to face the odd bit lines BLo of the second selection circuit block SB2. Also, the even bit lines BLe of the second selection circuit block SB2 may be arranged to face even bit lines BLe of the third selection circuit block SB3 adjacent to the second selection circuit block SB2. If the even and odd bit lines BLe and BLo are arranged in the above-described manner, since the same voltage may be applied to the same type bit lines in two adjacent selection circuit blocks, which face each other, depletion may not occur between the two adjacent selection circuit blocks. Therefore, a field stop ion implantation region may not be formed in an isolation region disposed between the two adjacent selection circuit blocks. Each of the selection circuit blocks will be described in detail hereinafter with reference to FIGS. 7 and 8.

Figure 7:
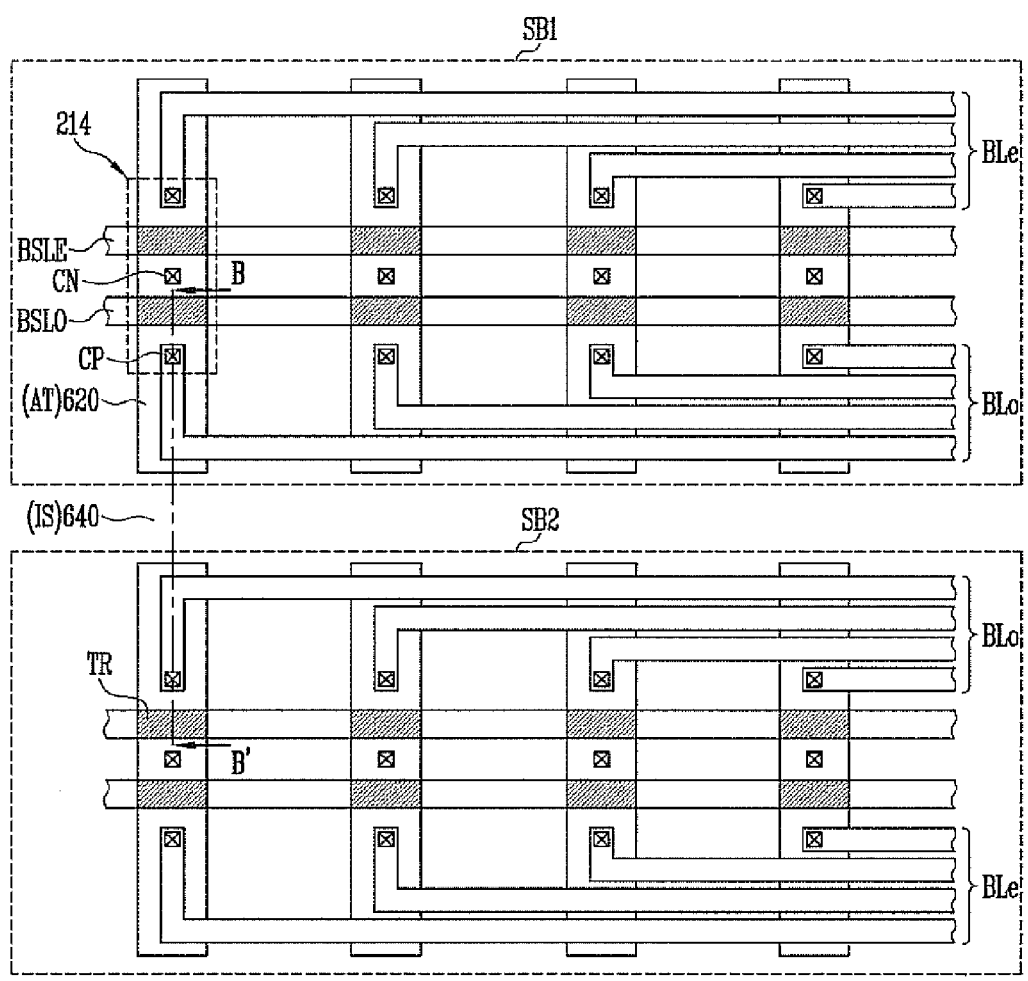
FIG. 7 illustrates a detailed layout diagram of selection circuit blocks shown in FIG. 6.
Figure 8:
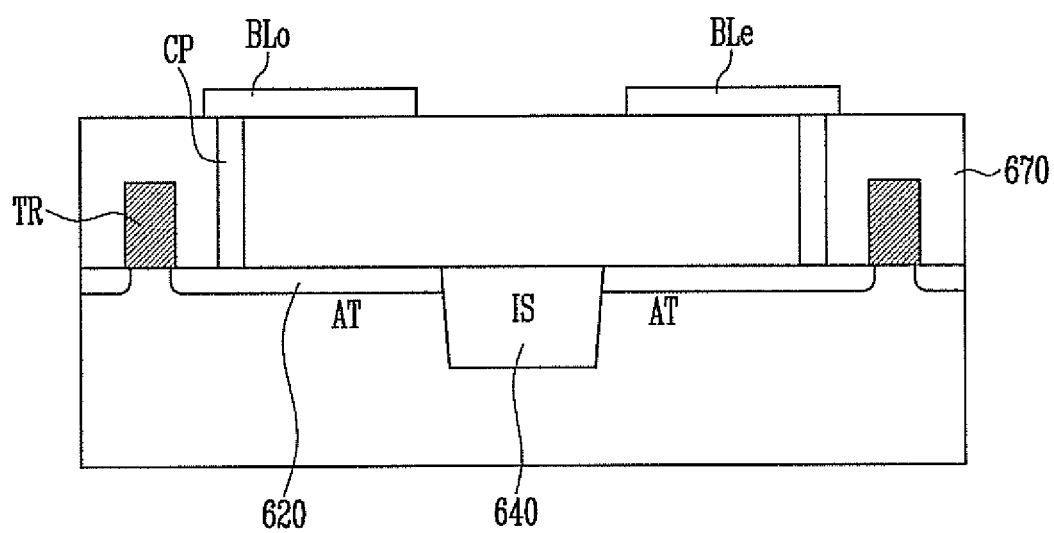
FIG. 8 illustrates a cross-sectional view taken along a line B-B' in FIG. 7.

FIG. 7 illustrates a detailed layout diagram of selection circuit blocks shown in FIG. 6, and FIG. 8 illustrates a cross-sectional view taken along a line B-B' in FIG. 7.

The first selection circuit block SB1 and the second selection circuit block SB2, which are spaced apart from each other in the first direction, will be described with reference to FIG. 7.

Referring to FIG. 7, the first selection circuit block SB1 include a plurality of selection circuits 214 spaced apart from one another in the second direction perpendicular to the first direction. Each of the selection circuits 214 may be formed in an active region AT of a semiconductor substrate. Active regions AT is defined by an isolation region IS disposed between the active regions, and an isolation layer 640 formed of an insulating material may be formed in the isolation region IS. The selection circuits 214 may be spaced apart from one another in the first direction in the first selection circuit block SB1, and an even gate line to which the even selection signal BSLE is applied and an odd gate line to which the odd selection signal BSLO is applied may be shared by the selection circuits 214 in the first selection circuit block SB1. A contact plug may be formed between the even gate line and the odd gate line and connected to the node CN. Contact plugs CP connected to the even or odd bit lines BLe or BLo may be formed in an opposite direction to a direction in which the contact plug connected to the node CN is formed with respect to each of gate lines. If the even selection signal BSLE is applied to the even gate line, the even bit lines BLe may be coupled to the node CN. Conversely, if the odd selection signal BSLO is applied to the odd gate line, the odd bit lines BLo may be coupled to the node CN.

Even bit lines BLe, an even gate line, an odd gate line, and odd bit lines BLo of the second selection circuit block SB2 may be arranged symmetrically with the even bit lines BLe, the even gate line, the odd gate line, and the odd bit lines BLo of the first selection circuit block SB1, respectively, in the first direction. Specifically, the odd bit lines BLo, the odd gate line, the even gate line, and the even bit lines BLe may be sequentially arranged from a region adjacent to the odd bit lines BLo of the first selection circuit block SB1.

In accordance with another embodiment, the semiconductor device may be implemented by changing signals applied to gate lines of the first and second selection circuit blocks SB1 and SB2. For instance, if the first selection circuit block SB1 is configured such that the even selection signal BSLE is applied to a first gate line of the first selection circuit block SB1 and the odd selection signal BSLO is applied to a second gate line thereof, the second selection circuit block SB2 may be configured such that the odd selection signal BSLO is applied to a first gate line of the second selection circuit block SB2 and the even selection signal BSLE is applied to a second gate line thereof. That is, since bit lines are selected or unselected by operations of transistors TR coupled to gate lines, occurrence of depletion in the isolation region IS may be prevented by changing signals applied to the gate lines such that symmetric bit lines of two adjacent selection circuit blocks are simultaneously selected or unselected.

Referring to FIG. 8, since a field stop region is not formed under the isolation region IS, an area occupied by a conventional field stop region formed in an isolation region IS may be reduced. In FIG. 8, a reference numeral 670 denotes an interlayer insulating layer, a reference numeral 620 denotes a junction region included in a transistor, and a reference numeral 640 denotes an isolation layer formed in an isolation region. For example, if a first voltage is applied to the odd bit lines BLo in the first selection circuit block SB1, since the same first voltage is also applied to the opposite odd bit lines BLo in the second selection circuit block SB2, depletion may not occur in a portion of the semiconductor substrate under the isolation region IS. As a result, an area of a semiconductor substrate required for forming the selection circuit blocks may be reduced by omitting forming of a field stop region, and the number of process steps may be reduced by omitting an ion implantation process for forming the field stop region.

As described above, according to embodiments of the present invention, bit line groups having the same type, e.g., odd bit line groups or even bit line groups, are arranged to face each other across an isolation region. As a result, even if a depletion cut-off region is not formed, the depletion as well as a drop in breakdown voltage may not be generated in a portion of a semiconductor substrate disposed under an isolation region, and a semiconductor device can be downscaled.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device comprising:
    a memory cell array including a plurality of memory cells coupled to first and second bit lines;
    page buffers; and
    a plurality of bit line selection circuit blocks, each of which includes a plurality of selection circuits configured to couple the first or second bit lines to the page buffers, wherein the bit line selection circuit blocks are arranged in a first direction, and the selection circuits in each of the bit line selection circuit blocks are arranged in a second direction perpendicular to the first direction,
    wherein a pair of the first and second bit lines is disposed in each of the plurality of selection circuits, so that first bit lines of adjacent selection circuit blocks face each other or second bit lines of adjacent selection circuit blocks face each other.

2. The device of claim 1, wherein each of the selection circuit blocks comprises:
    active regions spaced apart from one another; and
    first and second selection transistors disposed on each of the active regions of a semiconductor substrate between the first bit lines and the second bit lines.

3. The device of claim 2, wherein gates of the first selection transistors are coupled to a first gate line, and gates of the second selection transistors are coupled to a second gate line arranged parallel to the first gate line.

4. The device of claim 3, wherein the first gate line is disposed adjacent to the first bit lines, and the second gate line is disposed adjacent to the second bit lines.

5. The device of claim 2, wherein first junction regions of the first selection transistors are coupled to the first bit lines, and second junction regions of the second selection transistors are coupled to the second bit lines.

6. The device of claim 2, wherein sensing nodes of the page buffers are coupled to one another through a common junction region between the first and second selection transistors.

7. A semiconductor device comprising:
a memory cell array in which data is stored; and
a plurality of page buffers arranged in a first direction and coupled to the memory cell array through even and odd bit lines, wherein the page buffers include a plurality of bit line selection circuit blocks configured to select the even or odd bit lines, wherein the bit line selection circuit blocks are arranged in a second direction perpendicular to the first direction,
wherein each of the bit line selection circuit blocks comprises an even bit line group including the even bit lines, an odd bit line group including the odd bit lines, an even gate line coupled to a transistor configured to select the even bit line group, and an odd gate line coupled to a transistor configured to select the odd bit line group,
wherein the even gate line and the odd gate line are horizontally disposed between the even bit line group and the odd bit line group, the even bit line groups of adjacent bit line selection circuit blocks are disposed to face each other, and the odd bit line groups of adjacent bit line selection circuit blocks are disposed to face each other.

8. The device of claim 7, wherein each of the bit line selection circuit blocks includes a plurality of bit line selection circuits arranged apart from one another in the first direction.

9. The device of claim 8, wherein the bit line selection circuits are formed in respective active regions spaced apart from one another, and an even bit line, selection transistors, and an odd bit line of each of the bit line selection circuits are formed to be coupled to a corresponding active region of a semiconductor substrate.

10. A semiconductor device comprising:
a memory cell array in which data is stored; and
a page buffer group coupled to the memory cell array through bit lines, wherein the page buffer group includes first and second bit line selection circuit blocks arranged in a first direction,
wherein each of the bit line selection circuit blocks includes a first bit line group including the even bit lines, a second bit line group including the odd bit lines, and gate lines horizontally disposed between the first and second bit line groups, and
wherein the first and second bit line groups and the gate lines disposed in the first bit line selection circuit blocks are symmetrically disposed with the first and second bit line groups and the gate lines disposed in the second bit line selection circuit blocks.

11. The device of claim 10, wherein the gate lines comprise a first gate line coupled to gates of selection transistors configured to select the even bit lines and a second gate line coupled to gates of selection transistors configured to select the odd bit lines.

* * * * *